United States Patent
Tu et al.

(10) Patent No.: US 8,999,611 B2
(45) Date of Patent: Apr. 7, 2015

(54) MASK BLANK FOR SCATTERING EFFECT REDUCTION

(71) Applicant: Taiwan Semiconductor Manufacturing Co. Ltd., Hsin-Chu (TW)

(72) Inventors: Chih-Chiang Tu, Tauyen (TW); Chun-Lang Chen, Madou Township (TW); Jong-Yuh Chang, Jhubei (TW); Chien-Chih Chen, Tainan (TW); Chen-Shao Hsu, Huatan Township (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 28 days.

(21) Appl. No.: 13/788,105

(22) Filed: Mar. 7, 2013

(65) Prior Publication Data

US 2014/0255825 A1  Sep. 11, 2014

(51) Int. Cl.
*G03F 1/20* (2012.01)

(52) U.S. Cl.
CPC .......................... *G03F 1/20* (2013.01)

(58) Field of Classification Search
CPC .................... G03F 1/78; G03F 9/00
USPC ............ 430/5, 322, 323, 296, 394; 250/492.3
See application file for complete search history.

(56) References Cited

U.S. PATENT DOCUMENTS

| 8,158,305 | B2 | 4/2012 | Oh | |
| 2002/0012853 | A1* | 1/2002 | Suganuma et al. | 430/5 |
| 2008/0318139 | A1* | 12/2008 | Dersch et al. | 430/5 |

OTHER PUBLICATIONS

Tae-Seung Eom, et al.; "Comparative Study of Binary Intensity Mask and Attenuated Phase Shift Mask using Hyper-NA Immersion Lithography for Sub-45nm Era"; Optical Microlithography XXI, vol. 6924, 2008, p. 1-10.
Tsutomu Shoki; "EUVL Blank and Mask Activities at HOYA"; 5th NGL Workshop; Aug. 28-30, 2001, p. 1-16.

* cited by examiner

*Primary Examiner* — Stephen Rosasco
(74) *Attorney, Agent, or Firm* — Eschweiler & Associates, LLC (57) ABSTRACT

Some embodiments relate a method of forming a photomask for a deep ultraviolet photolithography process (e.g., having an exposing radiation with a wavelength of 193 nm). The method provides a mask blank for a deep ultraviolet photolithography process. The mask blank has a transparent substrate, an amorphous isolation layer located over the transparent substrate, and a photoresist layer located over the amorphous isolation layer. The photoresist layer is patterned by selectively removing portions of the photoresist layer using a beam of electrons. The amorphous isolation layer is subsequently etched according to the patterned photoresist layer to form one or more mask openings. The amorphous isolation layer isolates electrons backscattered from the beam of electrons from the photoresist layer during patterning, thereby mitigating CD and overlay errors caused by backscattered electrons.

20 Claims, 7 Drawing Sheets

MASK BLANK FOR SCATTERING EFFECT REDUCTION

BACKGROUND

An integrated chip typically comprises a plurality of different layers, which are processed according to different patterns. The various patterns used in depositing layers and/or doping regions on a semiconductor substrate are often defined by a process called photolithography.

A photolithography process is generally performed by first spin coating a layer of light sensitive photoresist layer onto the surface of a semiconductor substrate. A photomask is then used to selectively expose the photoresist layer to radiation (e.g., visible or ultraviolet light) to form patterns of exposed areas of the photoresist layer. After exposure, the photoresist layer is subjected to a chemical developer, which removes exposed areas of photoresist, selectively exposing areas of an underlying layer.

DETAILED DESCRIPTION

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

Photomasks may be produced by selectively etching a mask blank, according to a masking layer, to form one more patterned mask features. The masking layer may comprise a layer of photoresist that is selectively exposed and subsequently developed. In photomasks produced for advanced technology nodes (e.g., 22 nm, 16 nm, etc.) critical dimension (CD) and overlay errors are considerations. CD errors are variations in the size of on-chip features. Overlay errors are misalignments between a mask and a substrate, which cause a variation between an intended placement of an on-chip feature and an actual placement of an on-chip feature.

Electron beam (e-beam) writers may be used to expose a photoresist masking layer for high end photomasks in advanced technology nodes, since e-beams provide for very high resolution mask features. However, e-beam writing suffers from backside scattering effects, wherein electrons are reflected from an e-beam in a direction opposite the e-beam. The backscattered electrons may interact with the photoresist masking layer, thereby increasing the size of mask features and negatively effecting CD errors. E-beam writing also suffers from a charging effect, wherein electrons which build up on a surface of a mask blank affect an incoming e-beam and degrade overlay performance. CD errors and overlay errors are further increased in double patterning technologies, since overlay errors may be based upon an overlay error of a first mask and a second mask relative to one another.

CD and overlay errors can be mitigated by calibrating photolithography tools using writer proximity effect correction, writer fogging effect correction, and/or charging effect correction. For example, models for writer proximity effect correction can simulate backside scattering and provide a model to compensate this effect. However, such simulation models fail to accurately account for errors in some types of mask blanks or resist. Furthermore, the current correction models are not able to fulfill tight CD and overlay error specifications for double patterning technologies.

Accordingly, the present disclosure relates to a method of forming a photomask for a deep ultraviolet photolithography process (e.g., having an exposing radiation with a wavelength of 193 nm), and a related apparatus. In some embodiments, the method comprises providing a mask blank for a deep ultraviolet photolithography process. The mask blank comprises a transparent substrate, an amorphous isolation layer located over the transparent substrate, and a photoresist layer located over the amorphous isolation layer. The photoresist layer is patterned by selectively removing portions of the photoresist layer using a beam of electrons. The amorphous isolation layer is subsequently etched according to the patterned photoresist layer to form one or more mask openings. The amorphous isolation layer is configured to isolate electrons backscattered from the beam of electrons from the photoresist layer during patterning, thereby mitigating CD and overlay errors caused by backscattered electrons.

Figure 1:
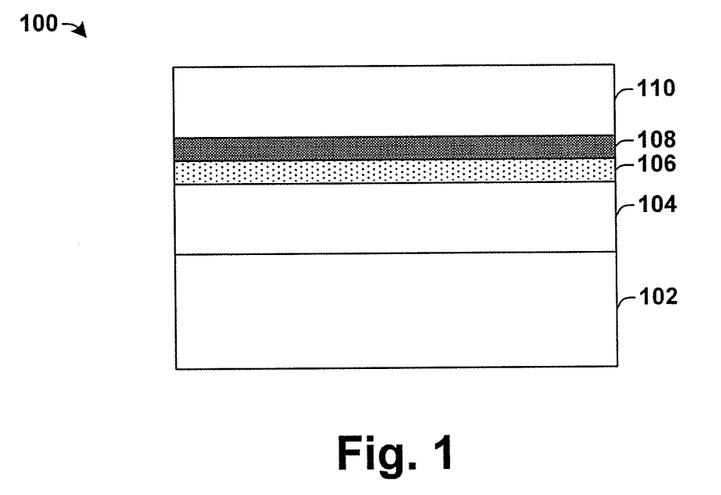
FIG. 1 illustrates some embodiments of a disclosed mask blank for a deep ultraviolet photolithography process.

FIG. 1 illustrates some embodiments of a disclosed mask blank 100 for a deep ultraviolet photolithography process. It will be appreciated that the disclosed mask blank 100 may be used to form a wide range of photomasks used in deep ultraviolet lithography (e.g., having an exposing radiation with a wavelength in a range of between 193 nm and 248 nm). For example, in some embodiments the disclosed mask blank may be used to form photomasks comprising APSM (attenuated phase shift masks), BIM (binary intensity masks), or OMOG (Opaque MoSi on Glass) masks.

The photomask blank 100 comprises a photoresist layer 110 disposed over a transparent substrate 102. In some embodiments, the transparent substrate 102 may comprise a quartz substrate. In some embodiments, the photoresist layer 110 may comprise a chemically amplified resin (CAR). In some embodiments, the photoresist layer 110 may comprise a positive tone photoresist, which becomes soluble when exposed to an electron beam (i.e., an e-beam). In other embodiments, the photoresist layer 110 may comprise a negative tone photoresist, which becomes insoluble when exposed to an electron beam (i.e., an e-beam).

An amorphous isolation layer 108 comprising an amorphous material is disposed between the transparent substrate 102 and the photoresist layer 110. The amorphous isolation layer 108 is configured to prevent the passage of backscattered electrons, so as to isolate the photoresist layer 110 from electrons of an e-beam that are backscattered (e.g., from the transparent substrate 102). By isolating the photoresist layer 110 from backscattered electrons, backscattering effects and electron charging effects are mitigated, reducing CD errors and overlay errors.

In some embodiments, the amorphous isolation layer 108 may have a thickness in a range of approximately 500 angstroms and approximately 1000 angstroms. While the thickness of the amorphous isolation layer 108 (500 to 1000 angstroms) may be insufficient to block high energy radiation from the extreme ultraviolet section of the electromagnetic spectrum (e.g., radiation having a wavelength of 13.5 nm), it is sufficient to isolate the photoresist layer 110 from backscattered electrons (e.g., to prevent electrons backscattered from the transparent substrate 102 from reaching the photoresist layer 110). In some embodiments, the amorphous isolation layer 108 comprises amorphous tantalum boron nitride (TaBN). In other embodiments, the amorphous isolation layer 108 comprises amorphous tungsten boron nitride (WBN), amorphous titanium silicon nitride (TiSiN), or amorphous tantalum silicon nitride (TaSiN).

In some embodiments, a phase shifting layer 104 may be disposed between the transparent substrate 102 and the amorphous isolation layer 108. The phase shifting layer 104 is configured to introduce a phase shift into electromagnetic radiation (e.g., deep ultraviolet radiation), which traverses the phase shifting layer 104. In some embodiments, the phase shifting layer 104 comprises an opaque layer of molybdenum silicide (MoSi). It will be appreciated that, the molybdenum silicide (MoSi) layer is not formed as alternating layers of molybdenum and silicide, which operate as a Bragg reflector, but instead is formed as an opaque shielding layer of molybdenum silicide that is used during photolithographic exposures to aid patterning of deep ultraviolet radiation. In other embodiments, the phase shifting layer 104 may comprise an opaque layer of molybdenum silicide oxynitride ($Mo_xSi_yON_z$). In some embodiments, the phase shifting layer 104 comprises a $Mo_xSi_yON_z$ layer that is a half tone material under 193 nm wavelength.

In some embodiments, an opaque shielding layer 106 may be positioned between the transparent substrate 102 and the amorphous isolation layer 108. The opaque shielding layer 106 is configured to block the transmission of electromagnetic radiation. In some embodiments, the opaque shielding layer 106 has an optical density (i.e., absorbance) of greater than 3.0 (i.e., corresponding to a transmittance of electromagnetic radiation of approximately 0.1 percent). In some embodiments, the opaque shielding layer 106 may comprise a chromium (Cr) or chromium oxide ($CrO_x$).

Figure 2:
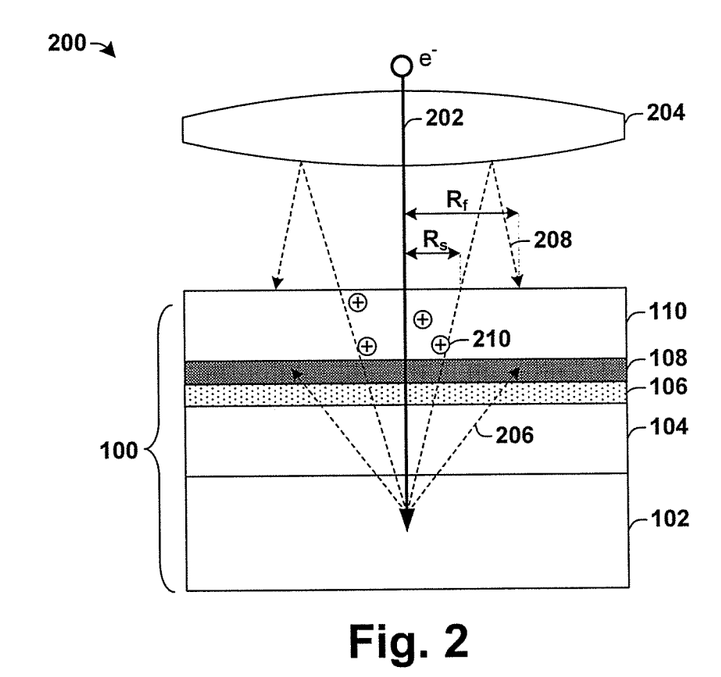
FIG. 2 illustrates a cross-sectional view illustrating how an amorphous layer within a disclosed mask blank reduces backside scattering effects and charging effects

FIG. 2 illustrates a cross-sectional view 200 illustrating how an amorphous isolation layer 108 within a disclosed mask blank 100 reduces backside scattering effects (e.g., narrow range backside scattering and wide range multi-scattering) and charging effects.

During mask formation, a photoresist layer 110 is exposed by way of an electron beam 202 (i.e., an e-beam). As shown in cross-sectional view 200, electrons are passed through a lens 204 that focuses the electrons to form the electron beam 202, which selectively exposes a pattern on the photoresist layer 110. In various embodiments, the lens 204 may comprise an electrostatic lens or a magnetic lens. The pattern typically may have a minimum feature size that is on the order of nanometers.

Electrons from the electron beam 202 may be reflected from one or more layers of the mask blank 100 in a direction from which the electron beam 202 came. The backscattered electrons may have an energy that is less than the energy of incident electrons in the electron beam 202. For example, in some embodiments, electrons within the electron beam have an energy of approximately 50 KeV, while backscattered electrons have a lower energy. Such backscattered electrons may cause a number of detrimental effects to a mask building process, including a proximity effect, a fogging effect, and a charging effect.

For example, the back scattering of electrons in one or more layers of mask blank 100 may cause back scattered electrons 206 to be reflected back towards the photoresist layer 110. The back scattered electrons 206 can expose a larger radius $R_s$ of the photoresist layer 110 due to the proximity effect. By exposing a larger radius $R_s$ of the photoresist layer 110 the size of mask openings increases, impacting CD errors. Similarly, the multi scattering of electrons between the lens 204 (e.g., an anti-reflective layer of the lens 204) and the mask blank 100 may also cause multi-scattered electrons 208 to be reflected back to the photoresist layer 110. The multi-scattered electrons 208 expose a larger radius $R_f$ of the photoresist layer 110 due to the fogging effect. By exposing a larger radius $R_f$ of the photoresist layer 110 the size of mask openings may increase, further impacting CD errors.

The charging effect is caused when secondary electrons generate positive charges 210 on the photoresist layer 110. The positive charges 210 generate an electrostatic force that acts upon electrons in the electron beam 202. The electrostatic force impacts the trajectory of the electron beam 202 as it enters into the mask blank 100, thereby increasing overlay errors.

The disclosed amorphous isolation layer 108 prevents backscattered electrons from reaching the photoresist layer 110. This is because the amorphous isolation layer 108 does not have grain boundaries, by which backscattered electrons can travel, thereby allowing the amorphous layer to prevent the passage of backscattered electrons through the amorphous isolation layer 108. By preventing the passage of backscattered electrons, the amorphous isolation layer 108 isolates the photoresist layer 110 from backscattered electrons to reduce backside scattering effects (e.g., narrow range backside scattering and wide range multi-scattering) and charging effects. For example, in some embodiments the amorphous isolation layer 108 can reduce the fogging range $R_f$ from approximately 10000 um to approximately 2952 um. In other embodiments, the amorphous isolation layer 108 can also reduce local area CD errors caused by the proximity effect from 3.78 nm to 1.78 nm and 3-sigma CD errors from 2.9 nm to 1.7 nm, for example.

Figure 3:
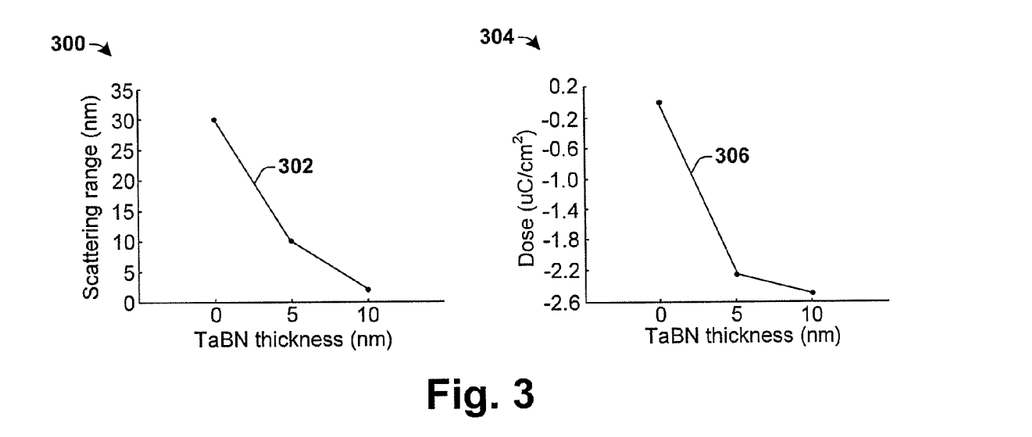
FIG. 3 shows graphs illustrating an exemplary reduction of backscattering and charging effects as a function of a thickness of the disclosed amorphous layer.

It has been appreciated that the effectiveness of the amorphous isolation layer 108 in mitigating backscattering effects and charging effects is dependent upon the thickness of the amorphous isolation layer 108. For example, FIG. 3 shows graphs, 300 and 304, illustrating an exemplary reduction of the scattering effects as a function of a thickness of the amorphous layer comprising tantalum boron nitride (TaBN).

Graph 300 illustrates a trend line 302 showing a correlation between a thickness of a disclosed TaBN amorphous isolation layer (x-axis) and a scattering range (y-axis). As shown in graph 300, the scattering range decreases as a thickness of the TaBN amorphous isolation layer increases. For example, a mask blank having no TaBN amorphous isolation layer (i.e., having a thickness of 0 nm) provides for a scattering range of 30 nm. A mask blank having a TaBN amorphous isolation layer with a thickness of 5 nm reduces the scattering range to 10 nm. A mask blank having a TaBN amorphous isolation layer with a thickness of 10 nm reduces the scattering range to 2 nm. Therefore, a mask blank having a disclosed TaBN amorphous isolation layer with a thickness of 10 nm will have a backside scattering range that is reduced by over 85% in comparison to a mask blank having no TaBN amorphous isolation layer.

Graph 304 illustrates a trend line 306 showing a correlation between a thickness of a disclosed TaBN amorphous isolation layer (x-axis) and a scattering flux (y-axis). As shown in graph 304, the scattering flux ($uC/cm^2$) decreases as a thickness of the TaBN amorphous isolation layer increases. For example, a mask blank having no TaBN amorphous isolation layer (i.e., having a thickness of 0 nm) provides for a scattering flux of 0 $uC/cm^2$. A mask blank having a TaBN amorphous isolation layer with a thickness of 5 nm reduces the scattering flux by approximately −2.2 $uC/cm^2$. A mask blank having a TaBN amorphous isolation layer with a thickness of 10 nm reduces the scattering flux by approximately −2.5 $uC/cm^2$. Therefore, a mask blank having a disclosed TaBN amorphous layer with a thickness of 10 nm will have a scattering flux that is reduced by −2.5 $uC/cm^2$ in comparison to a mask blank having no TaBN amorphous isolation layer.

Figure 4:
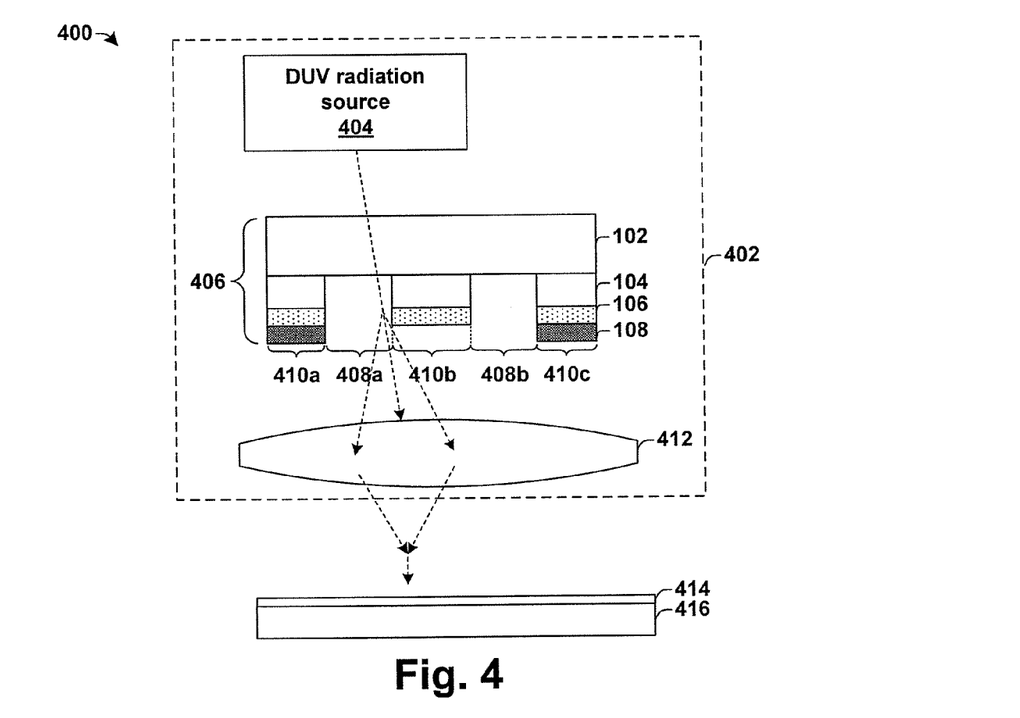
FIG. 4 illustrates some embodiments of a photolithography system comprising a photomask formed from a disclosed mask blank.

FIG. 4 illustrates a block diagram of some embodiments of a photolithography system 400 comprising a photomask 406 formed from a disclosed mask blank.

The photolithography system 400 comprises a photolithography tool 402. The photolithography tool 402 comprises a DUV radiation source 404 configured to generate deep ultraviolet (DUV) radiation having a wavelength of between 193 nm and 248 nm. In some embodiments, the photolithography tool is configured to generate DUV radiation from excimer lasers with wavelengths of 193 nm.

The DUV radiation is provided to a photomask 406, which selectively blocks the DUV radiation before providing the radiation to a lens 412. The lens 412 focuses the radiation to selectively expose a photoresist layer 414 on a semiconductor substrate 416. In some embodiments, the photolithography tool 402 may comprise a lens 412 having a numerical aperture of greater than 1.2, which is used to focus the DUV radiation. In some embodiments, the photolithography tool 402 may comprise an immersion lithography tool, which provides for a liquid (e.g., having a refractive index of greater than 1) between the lens 412 and the semiconductor substrate 416 to increase the resolution of the photolithography tool 402.

The photomask 406 comprises a plurality of mask openings 408a, 408b disposed between mask feature regions 410a-410c. The mask feature regions 410a-410c may comprise one or more patterned layers located on a transparent substrate 102. For example, in some embodiments, the mask feature regions 410a-410c may comprise a patterned amorphous isolation layer 108 and a patterned opaque shielding layer 106 stacked onto one another. In some embodiments, different mask feature regions 410a-410c may comprise different combinations of stacked layers. For example, in one embodiment, a first mask feature region 410a may comprise a patterned opaque shielding layer 106 disposed onto a patterned amorphous isolation layer 108, while a second mask feature region 410b may comprise a patterned opaque shielding layer 106 without a patterned amorphous isolation layer 108.

In some embodiments, the photolithography tool 402 may use a plurality of photomasks configured to perform a multiple patterning exposure of the photoresist layer 414 on the semiconductor substrate 416. For example, in some embodiments, a first photomask may be configured to expose a first portion of the photoresist layer 414 on the semiconductor substrate 416, and a second photomask may be configured to expose a second portion of the photoresist layer 414 on the semiconductor substrate 416.

It has been appreciated that in such multiple patterning technologies (e.g., double patterning technologies), CD and overlay errors may increase due to the use of multiple masks. For example, in advanced technology nodes (e.g., 22 nm, 16 nm, etc.) critical dimension (CD) and overlay errors increase using double patterning technology. In such advanced technology nodes, backside scattering effects (e.g., narrow range backside scattering and wide range multi-scattering) may increase random CD and overlay errors. The disclosed mask blank reduces the scattering effect reduction, thereby providing for smaller CD errors and smaller charging effects.

It will be appreciated that the disclosed mask blank may comprise different types of mask blanks, which are used to generate masks for deep ultraviolet (DUV) photolithography processes (e.g., having an exposing radiation with a wavelength between 193 nm and 248 nm). For example, FIGS. 5A-7 illustrate cross-sectional views of some embodiments of various mask blanks, including attenuated phase shift mask (APSM) blanks, opaque molybdenum silicide (MoSi) on glass (OMOG) mask blanks, or a binary-intensity mask (BIM) blank.

Figure 5A:
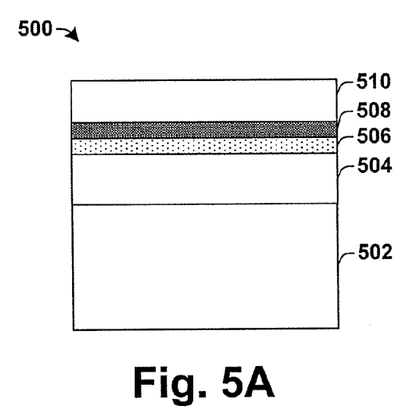
FIGS. 5A-5B illustrate cross-sectional views of some embodiments of disclosed opaque MoSi (molybdenum silicon) on glass mask blanks.

FIG. 5A illustrates cross-sectional view 500 of some embodiments of an OMOG mask blank. As shown in cross-sectional view 500, a molybdenum silicon oxy-nitride ($Mo_xSi_yON_z$) layer 504 is disposed over a quartz substrate 502. In some embodiments, the $Mo_xSi_yON_z$ layer 504 may have a chemical composition of x=0.05, y=0.5 and z=0.45. In some embodiments, the $Mo_xSi_yON_z$ layer 504 has a thickness of approximately 550 angstroms. A chromium oxide ($CrO_x$) layer 506 layer is disposed over the $Mo_xSi_yON_z$ layer 504. In some embodiments, the $CrO_x$ layer 506 may have a chemical composition of x=0 to 1. The $CrO_x$ layer 506 may have a thickness of approximately 50 angstroms. A tantalum boron nitride (TaBN) layer 508 is disposed over the $CrO_x$ layer 506. The TaBN layer 508 may have a thickness having a range of between approximately 50 angstroms and 100 angstroms. A chemically amplified resin (CAR) layer 510 is disposed over the TaBN layer 508. The CAR layer 510 may have a thickness in a range of between approximately 800 angstroms and 1500 angstroms. In some embodiments, the CAR layer 510 may comprise a positive tone configured to weaken when exposed to electromagnetic radiation (e.g., an e-beam).

Figure 5B:
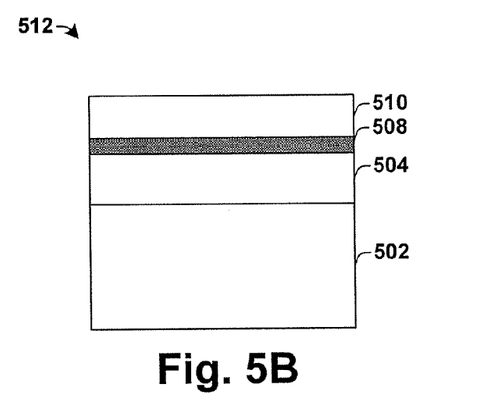

FIG. 5B illustrates a cross-sectional view 512 of some alternative embodiments of an OMOG mask blank. As shown in cross-sectional view 512, a molybdenum silicon oxy-nitride ($Mo_xSi_yON_z$) layer 504 is disposed over a quartz substrate 502. In some embodiments, the $Mo_xSi_yON_z$ layer 504 may have a chemical composition of x=0.01, y=0.5 and z=0.45. In some embodiments, the $Mo_xSi_yON_z$ layer 504 has a thickness of approximately 550 angstroms. A tantalum boron nitride (TaBN) layer 508 is disposed over the $Mo_xSi_yON_z$ layer 504. The TaBN layer 508 may have a thickness having a range of between approximately 50 angstroms and 100 angstroms. A chemically amplified resin (CAR) layer 510 is disposed over the TaBN layer 508. The CAR layer 510 may have a thickness in a range of between approximately 800 angstroms and 1500 angstroms. In some embodiments, the CAR layer 510 may comprise a positive tone configured to weaken when exposed to electromagnetic radiation.

Figure 6A:
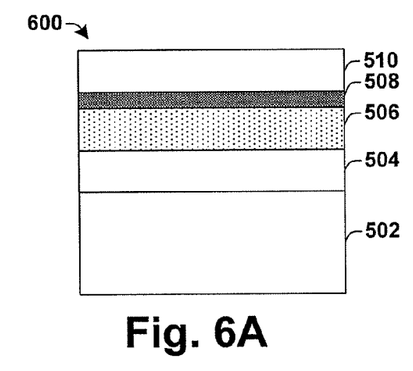
FIGS. 6A-6B illustrate cross-sectional views of some embodiments of disclosed attenuated phase shift mask blanks.

FIG. 6A illustrates a cross-sectional view 600 of some embodiments of an APSM mask blank. As shown in cross-sectional view 600, a molybdenum silicon oxy-nitride ($Mo_x Si_y ON_z$) layer 504 is disposed over a quartz substrate 502. In some embodiments, the $Mo_x Si_y ON_z$ layer 504 may have a chemical composition of x=0.01, y=0.55 and z=0.44. In some embodiments, the $Mo_x Si_y ON_z$ layer 504 has a thickness of approximately 690 angstroms. A chromium oxide ($CrO_x$) layer 506 is disposed over the $Mo_x Si_y ON_z$ layer. In some embodiments, the $CrO_x$ layer 506 may have a chemical composition of x=0 to 1. The $CrO_x$ layer 506 may have a thickness of approximately 480 angstroms. A tantalum boron nitride (TaBN) layer 508 is disposed over the $CrO_x$ layer 506. The TaBN layer 508 may have a thickness having a range of between approximately 50 angstroms and 100 angstroms. A chemically amplified resin (CAR) layer 510 is disposed over the TaBN layer 508. The CAR layer 510 may have a thickness in a range of between approximately 800 angstroms and 1500 angstroms. In some embodiments, the CAR layer 510 may comprise a positive tone configured to weaken when exposed to electromagnetic radiation.

Figure 6B:
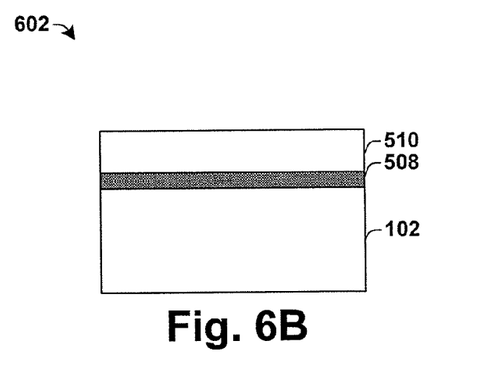

FIG. 6B illustrates a cross-sectional view 602 of some alternative embodiments of an APSM mask blank. As shown in cross-sectional view 602, a tantalum boron nitride (TaBN) layer 508 is disposed over a quartz substrate 502. The TaBN layer 508 may have a thickness with a range of between approximately 50 angstroms and approximately 100 angstroms. A chemically amplified resin (CAR) layer 510 is disposed over the TaBN layer 508. The CAR layer 510 may have a thickness in a range of between approximately 800 angstroms and 1500 angstroms. In some embodiments, the CAR layer 510 may comprise a positive tone configured to weaken when exposed to electromagnetic radiation.

Figure 7:
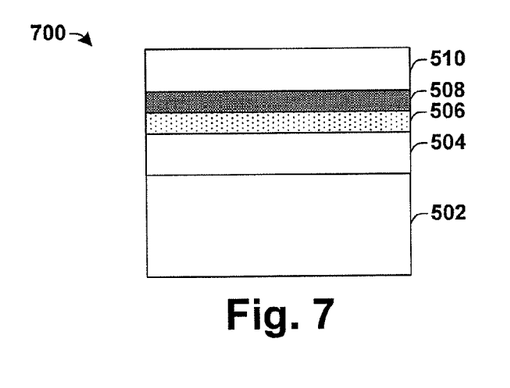
FIG. 7 illustrates a cross-sectional view of some embodiments of a disclosed binary intensity mask blank.

FIG. 7 illustrates cross-sectional view 700 of some embodiments of an BIM mask blank. As shown in cross-sectional view 700, a molybdenum silicon oxy-nitride ($Mo_x Si_y ON_z$) layer 504 is disposed over a quartz substrate 502. A chromium oxide ($CrO_x$) layer 506 layer is disposed over the $Mo_x Si_y ON_z$ layer. In some embodiments, the $CrO_x$ layer 506 may have a chemical composition of x=0 to 1. A tantalum boron nitride (TaBN) layer 508 is disposed over the $CrO_x$ layer 506. A chemically amplified resin (CAR) layer 510 is disposed over the TaBN layer 508.

Figure 8:
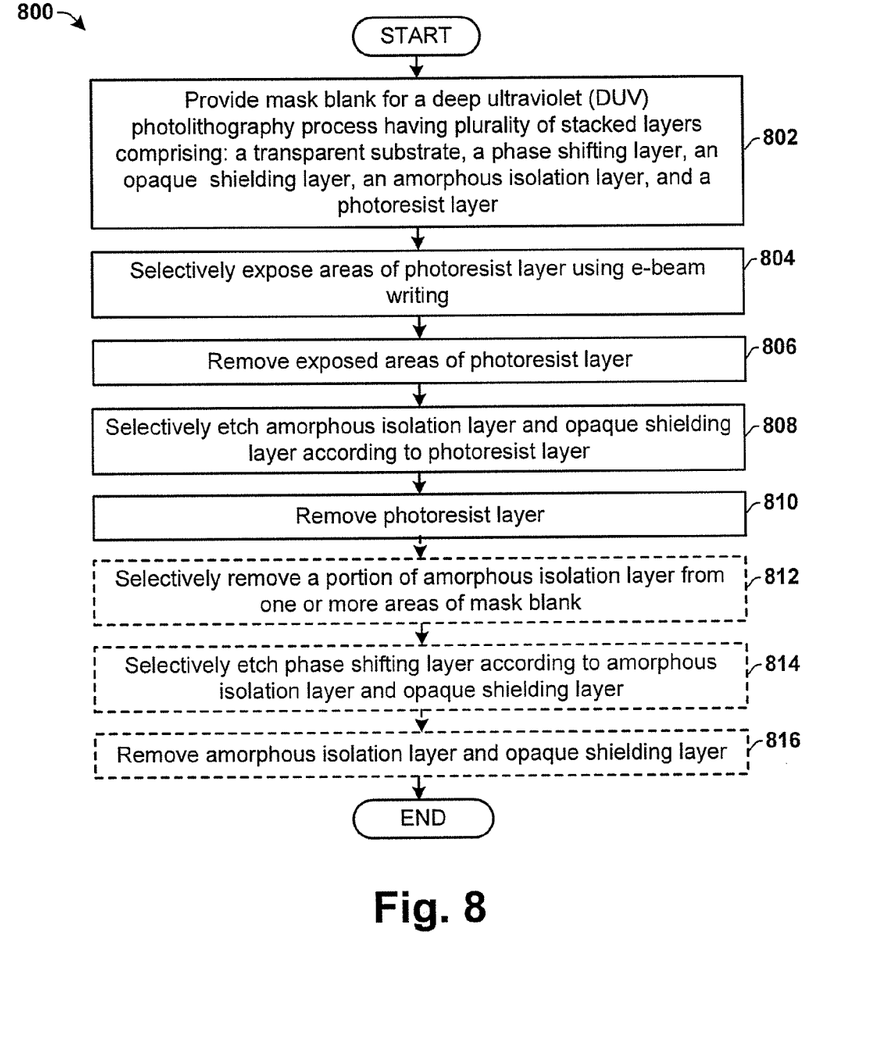
FIG. 8 is a flow diagram illustrating some embodiments of a disclosed method of forming a photomask for a deep ultraviolet photolithography process.

FIG. 8 is a flow diagram illustrating some embodiments of a disclosed method 800 of forming a photomask for a deep ultraviolet photolithography process.

It will be appreciated that while the disclosed methods (e.g., methods 800 and 1000) are illustrated and described as a series of acts or events, that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

At act 802, mask blank for a deep ultraviolet photolithography process is provided having a plurality of stacked layers. In various embodiments, the plurality of stacked layers may comprise one or more of: a transparent substrate, a phase shifting layer, an opaque shielding layer, an amorphous isolation layer, and a photoresist layer. In some embodiments, the phase shifting layer may comprise a molybdenum silicon oxy-nitride ($Mo_x Si_y ON_z$) layer. In some embodiments, the amorphous isolation layer comprises an amorphous tantalum boron nitride (TaBN), amorphous tungsten boron nitride (WBN), amorphous titanium silicon nitride (TiSiN), or amorphous tantalum silicon nitride (TaSiN). In some embodiments, the photoresist layer may comprise a chemically amplified resin having a positive tone configured to weaken when exposed to electromagnetic radiation.

At act 804, areas of the photoresist layer are selectively exposed by way of an electron beam (i.e., e-beam). In some embodiments, the electron beam may comprise a plurality of electrons having an energy of approximately 50 KeV.

At 806, exposed areas of the photoresist layer are removed. In some embodiments, the photoresist layer may be selectively removed by exposing the photoresist layer to a wet chemical developer.

At act 808, the amorphous isolation layer and shielding layer are selectively etched according to photoresist layer.

At act 810, the photoresist layer is removed.

At act 812, a portion of the amorphous isolation layer may optionally be selectively removed from one or more areas of mask blank. In various embodiments, the portion of the amorphous isolation layer may comprise a part of the amorphous isolation layer or the entire amorphous isolation layer. In some embodiments, removing a part of the amorphous isolation layer provides for an attenuated phase shift mask having mask feature regions with different properties.

At act 814, the phase shifting layer may optionally be selectively etched according to the amorphous isolation layer and the opaque shielding layer.

At act 816, the amorphous layer and opaque shielding layer may be optionally removed.

FIGS. 9A-9G illustrate cross-sectional views of some embodiments of an exemplary mask blank, whereon method 800 is implemented. Although FIGS. 9A-9G are described in relation to a method, it will be appreciated that the structures disclosed in FIGS. 9A-9G are not limited to such a method. Rather, it will be appreciated that the illustrated structures of FIGS. 9A-9G provide for a structural description of a mask blank and photomask that is able to stand alone independent of a method of formation.

Figure 9A:
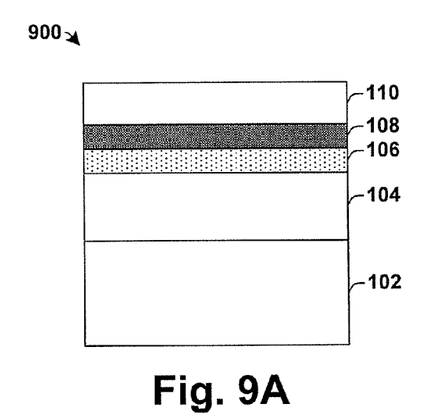
FIGS. 9A-9G illustrate cross-sectional views of some embodiments of an exemplary mask blank, whereon the method of FIG. 8 is implemented.

FIG. 9A illustrates some embodiments of a cross-sectional view 900, corresponding to act 802. Although cross-sectional view 900 illustrates certain layers, it will be appreciated that the disclosed mask blank is not limited to such layers. Rather, the disclosed mask blank may comprise additional layers or may omit layers than shown.

As shown in cross-sectional view 900, a mask blank is provided comprising a transparent substrate 102. A phase shifting layer 104 is formed over the transparent substrate 102. In some embodiments, the phase shifting layer 104 may comprise a molybdenum silicon oxy-nitride ($Mo_x Si_y ON_z$) layer having a thickness of between approximately 55 nm and approximately 69 nm. An opaque shielding layer 106 is formed over the phase shifting layer 104. In some embodiments, the opaque shielding layer 106 may comprise a chrome layer having a thickness of between approximately 5 nm and approximately 48 nm. An amorphous isolation layer 108 is formed over the opaque shielding layer 106. In some embodiments, the amorphous isolation layer 108 comprises an amorphous TaBN layer having a thickness of between approximately 5 nm and approximately 10 nm. A photoresist layer 110 is formed above the amorphous isolation layer 108. In some embodiments, the photoresist layer 110 may comprise a chemically amplified resin (CAR) having a thickness of between approximately 80 nm and approximately 150 nm.

Figure 9B:
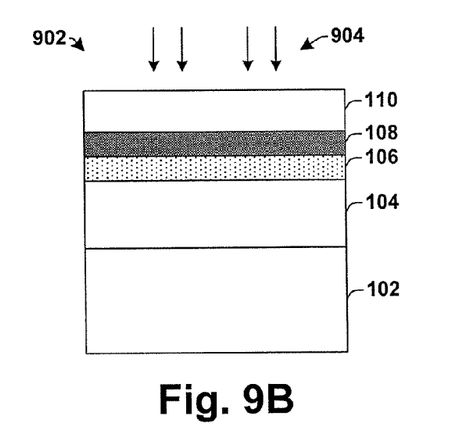

FIG. 9B illustrates some embodiments of a cross-sectional view 902, corresponding to act 804. As shown in cross-sectional view 902 an electron beam 904 is used to selectively expose the photoresist layer 110 of the mask blank. The electron beam 904 may comprise an e-beam having electrons with a kinetic energy of approximately 50 keV. In some embodiments the mask blank may be baked after e-beam writing has been completed. For example, in some embodiments, the mask blank may be exposed to a temperature of 120° C. for approximately 600 seconds to improve properties of a chemically amplified resin (CAR).

Figure 9C:
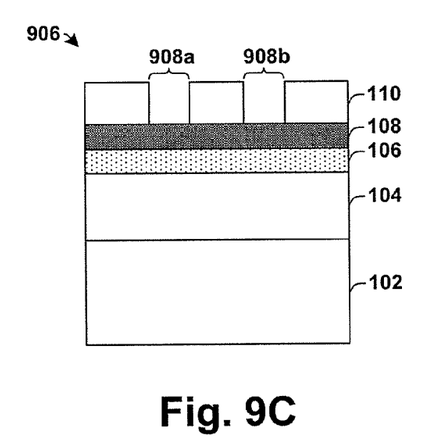

FIG. 9C illustrates some embodiments of a cross-sectional view 906, corresponding to act 806. As shown in cross-sectional view 906, exposed areas of the photoresist layer 110 are removed to form one or more openings 908a-908b in the photoresist layer 110. In some embodiments, exposed areas of the photoresist layer 110 may be removed by exposing the photoresist layer 110 to a photoresist developer comprising Tetramethylammonium hydroxide (TMAH) and water ($H_2O$).

Figure 9D:
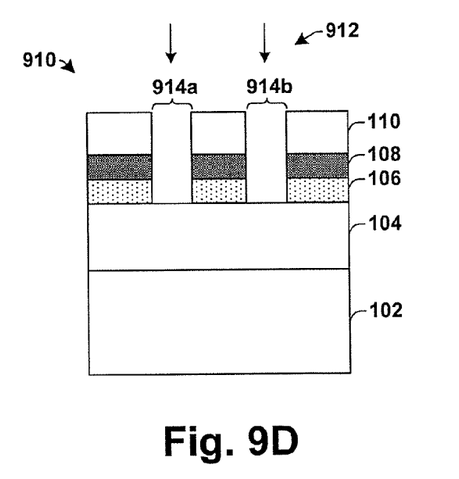

FIG. 9D illustrates some embodiments of a cross-sectional view 910, corresponding to act 808. As shown in cross-sectional view 910, the amorphous isolation layer 108 and the opaque shielding layer 106 are selectively exposed to an etchant 912 that removes portions of the amorphous isolation layer 108 and the opaque shielding layer 106 to form one or more openings 914a-914b in the amorphous isolation layer 108 and the opaque shielding layer 106. In some embodiments, the etchant 912 comprises a dry etchant having an inductively coupled plasma.

In embodiments, the inductively coupled plasma has etchant species comprising chlorine ($Cl_2$) and oxygen ($O_2$). For example, in some embodiments the inductively coupled plasma may be formed from input gases of $Cl_2/O_2$ provided into a processing chamber at a rate of 80/20 sccm (Standard Cubic Centimeters per Minute). In such embodiments, the chlorine may interact with an amorphous TaBN layer as shown in the following reaction:

$2TaBN+8Cl_2(g) \rightarrow 2TaCl_5(g)+2BCl_3(g)+N_2(g)$ wherein the $TaCl_5$, $2BCl_3$ and $N_2$ comprise gases, which will not result in particle residue on a mask surface.

Figure 9E:
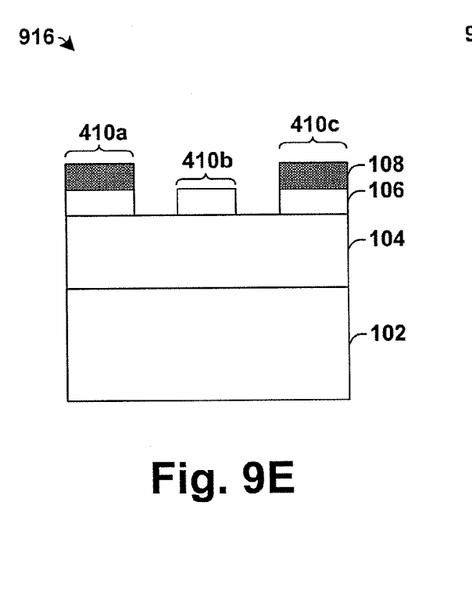

FIG. 9E illustrates some embodiments of a cross-sectional view 916, corresponding to act 810-812. Cross-sectional view 916 illustrates a photomask formed from acts 802-810. In some embodiments, the photomask of cross-sectional view 916 may comprise an attenuated phase shift mask, for example. In some embodiments, one or more sections of the amorphous isolation layer 108 may be removed from the substrate to form mask feature regions 410a-410c having different stacked layers. For example, a mask feature regions 410a and 410c may comprise a patterned opaque shielding layer 106 disposed onto a patterned amorphous isolation layer 108, while mask feature region 410b may comprise a patterned opaque shielding layer 106 without a patterned amorphous isolation layer 108.

Figure 9F:
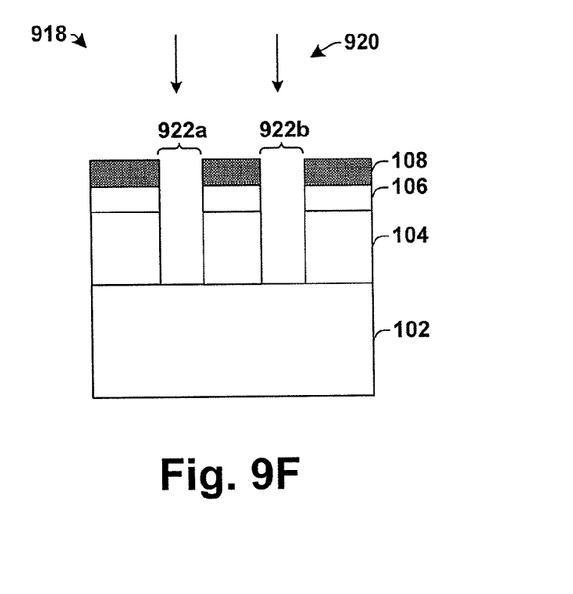

FIG. 9F illustrates some embodiments of a cross-sectional view 918, corresponding to act 814. As shown in cross-sectional view 918, the amorphous isolation layer 108 and/or the opaque shielding layer 106 are selectively exposed to an etchant 920 that removes portions of the phase shifting layer 104 to form one or more openings 922a-922b in phase shifting layer 104.

In some embodiments, the etchant 920 comprises a dry etchant comprising an inductively coupled plasma. In some embodiments, the inductively coupled plasma has etchant species comprising sulfur hexafluoride ($SF_6$) and helium (He). For example, in some embodiments the inductively coupled plasma may be formed from input gases of $SF_6$/He provided into a processing chamber at a rate of 5/20 sccm.

Figure 9G:
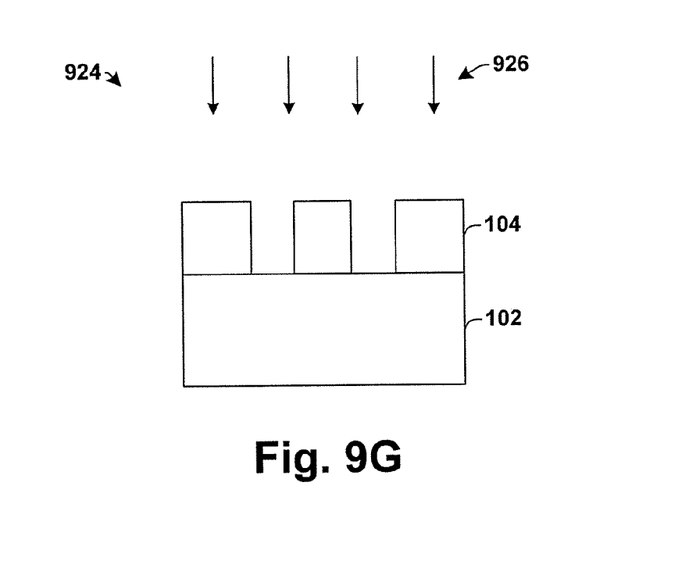

FIG. 9G illustrates some embodiments of cross-sectional views 924, corresponding to act 816. As shown in-cross sectional view 924, the amorphous isolation layer 108 and the opaque shielding layer 106 are selectively exposed to an etchant 926 that removes the amorphous isolation layer 108 and the opaque shielding layer 106. In some embodiments, the etchant 926 may comprise a dry etchant comprising an inductively coupled plasma. In some embodiments, the inductively coupled plasma has etchant species comprising chlorine ($Cl_2$) and oxygen ($O_2$). The resulting photomask illustrated in cross-sectional view 924 may comprise a binary intensity mask, in some embodiments.

Figure 10:
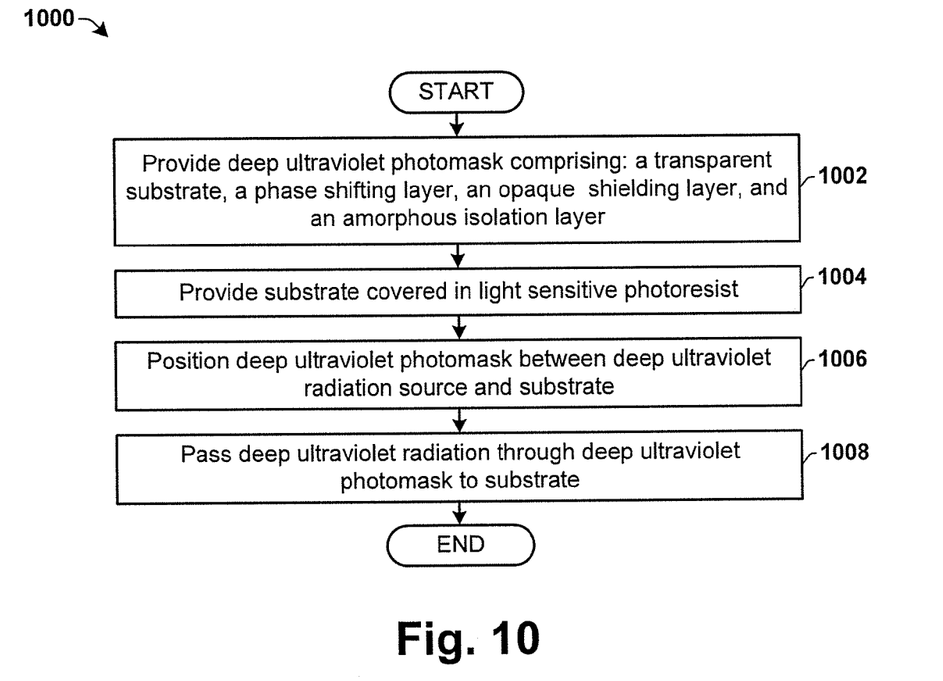
FIG. 10 is a flow diagram illustrating some examples of a method of exposing a substrate using some embodiments of a disclosed deep ultraviolet photomask.

FIG. 10 is a flow diagram illustrating some examples of a method 1000 of exposing a substrate using some embodiments of a disclosed deep ultraviolet photomask.

At act 1002, a deep ultraviolet photomask is provided. The deep ultraviolet photomask comprises: a transparent substrate, a phase shifting layer, an opaque shielding layer, and an amorphous isolation layer. In some embodiments, the phase shifting layer may comprise a molybdenum silicon oxy-nitride ($Mo_xSi_yON_z$) layer. In some embodiments, the amorphous isolation layer comprises an amorphous tantalum boron nitride (TaBN), amorphous tungsten boron nitride (WBN), amorphous titanium silicon nitride (TiSiN), or amorphous tantalum silicon nitride (TaSiN).

At act 1004, a substrate substrate covered in light sensitive photoresist is provided.

At act 1006, the deep ultraviolet photomask is positioned between a deep ultraviolet radiation source and the substrate. The deep ultraviolet radiation source is configured to generate deep ultraviolet (DUV) radiation having a wavelength of between 193 nm and 248 nm.

At act 1008, deep ultraviolet radiation is passed through the deep ultraviolet photomask to the substrate.

Although the disclosure has been shown and described with respect to a certain aspect or various aspects, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several aspects of the disclosure, such feature may be combined with one or more other features of the other aspects as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

Therefore, the present disclosure relates to a method of forming a photomask for a deep ultraviolet photolithography process (e.g., having an exposing radiation with a wavelength of 193 nm), and a related apparatus.

In some embodiments, the method comprises providing a mask blank for a deep ultraviolet photolithography process. The mask blank comprises a transparent substrate, an amorphous isolation layer located over the transparent substrate, and a photoresist layer located over the amorphous isolation layer. The method further comprises selectively removing portions of the photoresist layer using a beam of electrons, wherein the amorphous isolation layer is configured to isolate the photoresist layer from electrons backscattered from the beam of electrons. The method further comprises selectively etching the amorphous isolation layer according to the photoresist layer to form one or more mask openings and removing the photoresist layer.

In another embodiment, the present disclosure relates to a method of forming a photomask. The method comprises providing a mask blank for a deep ultraviolet photolithography process, comprising a quartz substrate, a molybdenum silicide oxynitride ($Mo_xSi_yON_z$) layer disposed over the quartz substrate, an amorphous isolation layer having no grain boundaries disposed over the $Mo_xSi_yON_z$ layer, and a photoresist layer comprising a chemically amplified resin disposed over the amorphous isolation layer. The method further comprises selectively exposing the photoresist layer using a beam of electrons, wherein the amorphous isolation layer is configured to isolate the photoresist layer from backscattered electrons from the beam of electrons. The method further comprises developing a photoresist layer using a photoresist developer to remove exposed areas of the photoresist layer. The method further comprises selectively etching the amorphous isolation layer according to the photoresist layer to form one or more mask openings and removing the photoresist layer.

In another embodiment, the present disclosure relates to a mask blank for a deep ultraviolet photolithography process. The mask blank comprises a transparent substrate. The mask blank further comprises an amorphous isolation layer comprising an amorphous material disposed over the transparent substrate. The mask blank further comprises a phase shifting layer comprising molybdenum silicide oxynitride ($Mo_xSi_yON_x$), wherein the phase shifting layer is disposed between the transparent substrate and the amorphous isolation layer and is configured to introduce a phase shift into deep ultraviolet radiation. The mask blank further comprises a photoresist layer disposed over the amorphous isolation layer. The amorphous isolation layer is configured to prevent transmission of backscattered electrons from the transparent substrate to the photoresist layer.

What is claimed is:

1. A method of forming a photomask, comprising:
   providing a mask blank for a deep ultraviolet photolithography process, comprising:
      a transparent substrate,
      an amorphous isolation layer comprising an amorphous material located over the transparent substrate,
      a photoresist layer located over the amorphous isolation layer;
   selectively removing portions of the photoresist layer using a beam of electrons, wherein the amorphous isolation layer is configured to isolate the photoresist layer from electrons backscattered from the beam of electrons;
   selectively etching the amorphous isolation layer according to the photoresist layer to form one or more mask openings;
   removing the photoresist layer;
   selectively removing a portion of the amorphous isolation layer.

2. The method of claim 1,
   wherein the amorphous isolation layer comprises a thickness having a range of between approximately 500 angstroms and approximately 1000 angstroms.

3. The method of claim 1,
   wherein the amorphous isolation layer comprises amorphous tantalum.

4. The method of claim 1, wherein selectively removing portions of the photoresist layer, comprises:
   exposing the photoresist layer to the electron beam, which has a power of approximately 50 KeV; and
   developing the photoresist layer using a developer comprising Tetramethylammonium hydroxide (TMAH) and water (H2O) to remove exposed photoresist.

5. The method of claim 1, wherein the mask blank further comprises:
   a phase shifting layer disposed between the transparent substrate and the amorphous isolation layer, wherein the phase shifting layer is configured to introduce a phase shift into electromagnetic radiation passing through the one or more masking openings.

6. The method of claim 5,
   wherein the phase shifting layer comprises molybdenum silicide oxynitride ($Mo_xSi_yON_z$).

7. The method of claim 1, wherein the mask blank further comprises:
   an opaque shielding layer disposed between the transparent substrate and the amorphous isolation layer, wherein the opaque shielding layer comprises chromium (Cr) or chromium oxide ($CrO_x$).

8. The method of claim 7, further comprising:
   selectively etching the amorphous isolation layer and the opaque shielding according to the photoresist layer using an inductively coupled plasma having an etchant species comprising chlorine ($Cl_2$) and oxygen ($O_2$).

9. The method of claim 1, wherein the amorphous isolation layer comprises amorphous tantalum boron nitride (TaBN).

10. A method of forming a photomask, comprising:
    providing a mask blank for a deep ultraviolet photolithography process, comprising:
       a quartz substrate;
       a molybdenum silicide oxynitride ($Mo_xSi_yON_z$) layer abutting the quartz substrate;
       an amorphous isolation layer comprising an amorphous material having no grain boundaries disposed over the $Mo_xSi_yON_z$ layer, and
       a photoresist layer comprising a chemically amplified resin abutting the amorphous isolation layer;
    selectively exposing the photoresist layer using a beam of electrons, wherein the amorphous isolation layer is configured to isolate the photoresist layer from backscattered electrons from the beam of electrons;
    developing the photoresist layer using a photoresist developer to remove exposed areas of the photoresist layer;
    selectively etching the amorphous isolation layer according to the photoresist layer to form one or more mask openings; and
    removing the photoresist layer.

11. The method of claim 10,
    wherein the amorphous isolation layer comprises a thickness having a range of between approximately 500 angstroms and approximately 1000 angstroms.

12. The method of claim 10,
    wherein the amorphous isolation layer comprises amorphous tantalum.

13. The method of claim 10, further comprising:
    selectively removing a portion of the amorphous isolation layer.

14. The method of claim 10, further comprising:
    selectively etching the $Mo_xSi_yON_z$ layer according to the one or more mask openings in the amorphous isolation layer; and
    removing the amorphous isolation layer.

15. The method of claim 10, wherein the mask blank further comprises:

an opaque shielding layer disposed between the quartz substrate and the amorphous isolation layer, wherein the opaque shielding layer comprises chromium (Cr) or chromium oxide ($CrO_x$).

16. A mask blank for a deep ultraviolet photolithography process, comprising:
    a transparent substrate;
    an amorphous isolation layer comprising an amorphous material disposed over the transparent substrate;
    a phase shifting layer comprising molybdenum silicide oxynitride ($Mo_xSi_yON_x$), wherein the phase shifting layer is disposed between the transparent substrate and the amorphous isolation layer and is configured to introduce a phase shift into deep ultraviolet radiation; and
    a photoresist layer disposed over the amorphous isolation layer,
    wherein the amorphous isolation layer is configured to prevent transmission of backscattered electrons from the transparent substrate to the photoresist layer.

17. The mask blank of claim 16,
    wherein the amorphous isolation layer comprises amorphous tantalum boron nitride (TaBN).

18. The mask blank of claim 17, wherein the amorphous isolation layer has a thickness having a range of between approximately 500 angstroms and approximately 1000 angstroms.

19. The mask blank of claim 16,
    wherein the amorphous isolation layer comprises amorphous tungsten or amorphous titanium.

20. The mask blank of claim 16, further comprising:
    an opaque shielding layer positioned between the transparent substrate and the amorphous isolation layer, wherein the opaque shielding layer comprises chromium (Cr) or chromium oxide ($CrO_x$) and has an optical density of greater than 3.0.

* * * * *